(12) United States Patent
Umada et al.

(10) Patent No.: US 11,180,834 B2
(45) Date of Patent: Nov. 23, 2021

(54) GRAIN-ORIENTED ELECTRICAL STEEL SHEET AND PRODUCTION METHOD FOR GRAIN-ORIENTED ELECTRICAL STEEL SHEET

(71) Applicant: JFE Steel Corporation, Tokyo (JP)

(72) Inventors: Takumi Umada, Tokyo (JP); Shigehiro Takajo, Tokyo (JP); Takashi Terashima, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 108 days.

(21) Appl. No.: 16/471,175

(22) PCT Filed: Dec. 6, 2017

(86) PCT No.: PCT/JP2017/043788
§ 371 (c)(1),
(2) Date: Jun. 19, 2019

(87) PCT Pub. No.: WO2018/116829
PCT Pub. Date: Jun. 28, 2018

(65) Prior Publication Data
US 2019/0390309 A1    Dec. 26, 2019

(30) Foreign Application Priority Data
Dec. 21, 2016    (JP) .............................. JP2016-248070

(51) Int. Cl.
*C22C 38/06*    (2006.01)
*C22C 38/00*    (2006.01)
(Continued)

(52) U.S. Cl.
CPC ............ *C22C 38/06* (2013.01); *C22C 38/001* (2013.01); *C22C 38/02* (2013.01); *C22C 38/04* (2013.01);
(Continued)

(58) Field of Classification Search
None
See application file for complete search history.

(56) References Cited

U.S. PATENT DOCUMENTS 3,932,236 A    1/1976  Wada et al.
7,169,479 B2   1/2007  Schuhmacher et al.
(Continued)

FOREIGN PATENT DOCUMENTS

CN    1236824 A     12/1999
CN    103492606 A    1/2014
(Continued)

OTHER PUBLICATIONS

Chinese Office Action for Chinese Application No. 201780073544.2, dated Mar. 20, 2020 with English Search Report, 10 pages.
(Continued)

*Primary Examiner* — Daniel J. Schleis
(74) *Attorney, Agent, or Firm* — RatnerPrestia (57) ABSTRACT

Provided are: a grain-oriented electrical steel sheet that has an excellent magnetic property and coating adhesiveness after stress relief annealing; and a production method therefor. This grain-oriented electrical steel sheet has: a steel sheet; a metal coating which contains a metal element and which is disposed on the steel sheet; a coating layer A which is a ceramic coating having an oxide content of less than 30 mass % and which is disposed on the metal coating; and a coating layer B which is an insulating tensile coating containing an oxide and which is disposed on the coating layer A, wherein the metal coating has a thickness of 1.0-10.0 nm, and in the metal element, the atomic radius ratio represented by formula (1) is at least 10%, when the atomic radius of iron is defined as RFe and the atomic radius of the metal element as RA.

$(|R_{Fe}-R_A|/R_{Fe}) \times 100.$    Formula (1):

20 Claims, 2 Drawing Sheets

(51) Int. Cl.
*C22C 38/02* (2006.01)
*C22C 38/04* (2006.01)
*C23C 14/06* (2006.01)
*C23C 14/22* (2006.01)
*C23C 26/00* (2006.01)
*C23C 28/04* (2006.01)
*H01F 1/147* (2006.01)

(52) U.S. Cl.
CPC ........ *C23C 14/0641* (2013.01); *C23C 14/221* (2013.01); *C23C 26/00* (2013.01); *C23C 28/04* (2013.01); *H01F 1/147* (2013.01); *C22C 2202/02* (2013.01); *Y10T 428/12549* (2015.01)

(56) References Cited

U.S. PATENT DOCUMENTS

| | | |
|---|---|---|
| 2002/0011278 A1 | 1/2002 | Komatsubara et al. |
| 2010/0055481 A1 | 3/2010 | Kubo et al. |
| 2014/0048181 A1 | 2/2014 | Banik et al. |
| 2016/0260531 A1 | 9/2016 | Terashima et al. |

FOREIGN PATENT DOCUMENTS

| | | | |
|---|---|---|---|
| CO | 105593393 | A | 5/2016 |
| JP | 5224499 | B2 | 7/1977 |
| JP | 6358805 | A | 3/1988 |
| JP | 63250419 | A | 10/1988 |
| JP | 6468425 | A | 3/1989 |
| JP | 01176034 | A | 7/1989 |
| JP | 046264 | A | 1/1992 |
| JP | 067527 | B2 | 1/1994 |
| JP | 07173641 | A | 7/1995 |
| JP | 11181557 | A | 7/1999 |
| JP | 11222654 | A | 8/1999 |
| JP | 2002080959 | A | 3/2002 |
| JP | 2002194564 | A | 7/2002 |
| JP | 2004060038 | A | 2/2004 |
| JP | 2004099998 | A | 4/2004 |
| JP | 2005089810 | A | 4/2005 |
| JP | 2005264234 | A | 9/2005 |
| JP | 2006253555 | A | 9/2006 |
| RU | 2405842 | C1 | 12/2010 |

OTHER PUBLICATIONS

European Communication for European Application No. 17 883 264.8, dated Jan. 20, 2021, 9 pages.
Korean Office Action for Korean Application No. 10-2019-7016170, dated Feb. 1, 2021, with Concise Statement of Relevance of Office Action, 7 pages.
Chinese Office Action for Chinese Application No. 201780073544.2, dated Mar. 30, 2021 with Search Report, 10 pages.
Inokuti, "Structure at Near-Surface of TiN-Coated Grain Oriented Silicon Steel Sheet Characterized by Ultra-Low Iron Loss," Materials Transactions, JIM, vol. 38, No. 3, 1997, pp. 266-274.
Goel et al., "CrAlN Coating to Enhance the Power Loss and Magnetostriction in Grain Oriented Electric Steel," AIP Advances, vol. 6, No. 5, 2016, 5 pages.
Inokuti et al., "Effect of Difference in Ion Plating Method on the Magnetic Properties of TiN-Coated Grain Oriented Silicon Steel Sheet," Materials Transactions, JIM, vol. 36, No. 8, 1995, pp. 1081-1087.
Extended European Search Report for European Application No. 17883264.8, dated Sep. 24, 2019, 11 pages.
Russian Office Action for Russian Application No. 2019119296, dated Oct. 16, 2019, with translation, 8 pages.
International Search Report and Written Opinion for International Application No. PCT/JP2017/043788, dated March 5, 2018—6 pages.
Panjan et al., "Oxidation of TiN, ZrN, TiZrN, CrN, TiCrN and TiN/CrN multilayer hard coatings reactively sputtered at low temperature", Thin Solid Films, 281-282, Aug. 1996—pp. 298-301.

GRAIN-ORIENTED ELECTRICAL STEEL SHEET AND PRODUCTION METHOD FOR GRAIN-ORIENTED ELECTRICAL STEEL SHEET

CROSS REFERENCE TO RELATED APPLICATIONS

This is the U.S. National Phase application of PCT/JP2017/043788, filed Dec. 6, 2017, which claims priority to Japanese Patent Application No. 2016-248070, filed Dec. 21, 2016, the disclosures of each of these applications being incorporated herein by reference in their entireties for all purposes.

FIELD OF THE INVENTION

The present invention relates to a grain oriented electrical steel sheet and a producing method of a grain oriented electrical steel sheet.

BACKGROUND OF THE INVENTION

Grain oriented electrical steel sheets are soft magnetic materials used as materials for iron cores of transformers, generators and the like. Grain oriented electrical steel sheets are characterized in having a crystal structure in which the <001> orientation that is an easy magnetization axis of iron is highly-precisely aligned in the rolling direction of the steel sheet. The texture as above is formed through finishing annealing of a manufacturing process of a grain oriented electrical steel sheet, which finishing annealing allows crystal grains with the {110}<001> orientation referred to as the so-called Goss orientation to preferentially grow to an enormous size. Grain oriented electrical steel sheets as products are required to have such magnetic properties as high magnetic flux density and low iron loss.

The magnetic properties of a grain oriented electrical steel sheet are improved by applying a tensile stress (tension) to a steel sheet surface. As one conventional technique of applying a tensile stress to a steel sheet, a technique in which a forsterite coating of about 2 μm thickness is formed on a steel sheet surface and another coating of about 2 μm thickness primarily composed of silicon phosphate is formed on the forsterite coating is typically used.

To be more specific, the silicon phosphate coating having a lower thermal expansion coefficient than that of the steel sheet is formed at high temperature and cooled to room temperature, whereby a tensile stress is applied to the steel sheet using a difference in thermal expansion coefficient between the steel sheet and the silicon phosphate coating.

This silicon phosphate coating also acts as an insulating coating that is indispensable for a grain oriented electrical steel sheet. Owing to the insulation, a local eddy current is prevented from being generated in the steel sheet.

A surface of the grain oriented electrical steel sheet having undergone finishing annealing is smoothed by chemical polishing or electrolytic polishing, and then a tensile stress is applied by means of the coating above the steel sheet, whereby iron loss can remarkably be decreased.

Meanwhile, the forsterite coating between the steel sheet and the silicon phosphate coating adheres to the steel sheet owing to the anchoring effect. Therefore, the smoothness of the steel sheet surface inevitably deteriorates. The adhesion between silicon phosphate and metal is so low that a silicon phosphate coating cannot be formed directly on a mirror-finished surface of a steel sheet. Thus, in the coating structure of a conventional grain oriented electrical steel sheet (steel sheet/forsterite coating/silicon phosphate coating), a surface of a steel sheet cannot be smoothed.

In Patent Literature 1, in order to maintain the smoothness of a steel sheet surface and also apply a large tensile stress to the steel sheet, a ceramic coating made of TiN for instance is formed on the steel sheet by a CVD method or a PVD method. At this time, since a tensile stress applied to the steel sheet is proportional to the thickness of the ceramic coating, the ceramic coating is formed to have a thickness of at least 1 μm.

CVD methods and PVD methods, however, cause high manufacturing costs, and accordingly, coatings are desired to have a small thickness to the utmost extent, which in turn results in a decrease in tensile stress applied to a steel sheet.

In Patent Literature 2, to compensate a decrease in tension due to such a small coating thickness or to apply a much higher tension to a steel sheet, an insulation tension coating made of silicon phosphate is formed on a ceramic coating with a thickness of 1 μm or less.

PATENT LITERATURES

Patent Literature 1: JP 01-176034 A
Patent Literature 2: JP 64-068425 A

SUMMARY OF THE INVENTION

The present inventors studied a grain oriented electrical steel sheet in which an insulation tension coating was formed on a ceramic coating. As a result, it was found that when a demander or the like subjects the grain oriented electrical steel sheet to stress relief annealing, this sometimes causes the ceramic coating to peel off from the associated steel sheet or results in poor magnetic properties of the grain oriented electrical steel sheet.

The present invention has been made in view of the above and aims at providing a grain oriented electrical steel sheet having excellent coating adhesion property and magnetic properties after stress relief annealing, as well as a producing method thereof.

The present inventors have made an intensive study to achieve the foregoing objects and as a result found that, when specific coating structures are employed for a ceramic coating and an insulation tension coating, the coating adhesion property and the magnetic properties are both excellent even after stress relief annealing. The invention has been thus completed.

Specifically, embodiments of the present invention provides the following [1] to [12].

[1] A grain oriented electrical steel sheet, comprising:
a steel sheet;
a metal coating containing metal element and disposed on the steel sheet;
a coating layer A that is a ceramic coating containing an oxide in an amount of less than 30 mass % and disposed on the metal coating; and
a coating layer B that is an insulation tension coating containing an oxide and disposed on the coating layer A,
wherein the metal coating has a thickness of 1.0 to 10.0 nm, and
wherein the metal element has an atomic radius rate of 10% or more, the atomic radius rate being represented by Formula (1):

$$(|R_{Fe} - R_A|/R_{Fe}) \times 100 \tag{1}$$

where $R_{Fe}$ denotes an atomic radius of iron, and $R_A$ denotes an atomic radius of the metal element.

[2] The grain oriented electrical steel sheet according to [1] above,
wherein the metal element is at least one selected from the group consisting of Ti, Y, Zr, Nb, Mo, Hf, Ta, W and C.

[3] The grain oriented electrical steel sheet according to [1] or [2] above,
wherein the metal element is Ta or W.

[4] The grain oriented electrical steel sheet according to any one of [1] to [3] above,
wherein the coating layer A has a thickness of not less than 0.01 μm.

[5] The grain oriented electrical steel sheet according to any one of [1] to [4] above,
wherein the coating layer A has a thickness of not more than 0.40 μm.

[6] The grain oriented electrical steel sheet according to any one of [1] to [5] above,
wherein the coating layer B has a thickness of not less than 1.0 μm.

[7] The grain oriented electrical steel sheet according to any one of [1] to [6] above,
wherein the coating layer B has a thickness of not more than 10.0 μm.

[8] The grain oriented electrical steel sheet according to any one of [1] to [7] above,
wherein the coating layer A contains a nitride or a carbonitride.

[9] A grain oriented electrical steel sheet producing method of producing the grain oriented electrical steel sheet according to any one of [1] to [8] above,
wherein the metal coating is formed by irradiating the steel sheet with metal ions to attach the metal ions to the steel sheet or by attaching, to the steel sheet, metal element ejected from a filament during irradiation of the steel sheet with inert gas ions.

[10] The grain oriented electrical steel sheet producing method according to [9] above,
wherein a material of the filament is W or Ta.

[11] The grain oriented electrical steel sheet producing method according to [9] or [10] above,
wherein the coating layer A is formed by a chemical vapor deposition method or a physical vapor deposition method.

[12] The grain oriented electrical steel sheet producing method according to any one of [9] to [11] above,
wherein the coating layer B is formed by applying a coating chemical solution on the coating layer A with an application roll, followed by baking in a nitrogen atmosphere.

The present invention can provide a grain oriented electrical steel sheet having excellent coating adhesion property and magnetic properties after stress relief annealing, as well as a producing method thereof.

DETAILED DESCRIPTION OF EMBODIMENTS OF THE INVENTION

[Findings Obtained by Inventors]

A ceramic coating with a thickness of not more than 1.00 μm (e.g., 0.30 μm) was formed on a steel sheet, and an insulation tension coating made of silicon phosphate was formed thereon; when the resulting steel sheet was subjected to stress relief annealing, the ceramic coating peeled off from the steel sheet (i.e., the coating adhesion property deteriorated) in some cases. The present inventors conducted many experiments to find out why this occurred and now have the following ideas.

The use of silicon phosphate having a low thermal expansion coefficient as a material for the insulation tension coating is advantageous for increasing a tensile stress applied by the insulation tension coating to the associated steel sheet and thereby improving the magnetic properties, while components in the insulation tension coating oxidize the ceramic coating under a high temperature environment, thus generating reaction products.

Subsequently, the reaction products diffuse in the ceramic coating from the interface between the insulation tension coating and the ceramic coating toward the steel sheet during stress relief annealing at 800° C. for 3 hours; when the reaction products further diffuse and reach the interface between the ceramic coating and the steel sheet, they react with Fe of the steel sheet and form precipitates.

Then, during a cooling process in stress relief annealing, i.e., when a stress starts to be applied to the interface between the steel sheet and the ceramic coating due to a difference in thermal expansion coefficient, the precipitates cannot fully receive the stress and consequently peel off from the steel sheet. Thus, the ceramic coating peels off from the steel sheet. In other words, the coating adhesion property deteriorates.

To cope with it, the present inventors considered forming a metal coating on a surface of a steel sheet to suppress the generation of precipitates that adversely affect the coating adhesion property.

For this purpose, formation of a metal coating having low reactivity should be effective. If, however, the metal coating dissolves in the steel sheet to form a solid solution, the generation of precipitates cannot be sufficiently suppressed. In order to avoid a high cost, the metal coating naturally needs to be thin, and the addition of other processes such as plating is also unfavorable.

The present inventors found that when metal element having an atomic radius rate of 10% or more is attached to a surface of a steel sheet by ion irradiation, a metal coating can be formed on the steel sheet without its dissolution in the steel sheet with no cost increase, the atomic radius rate being represented by Formula (1):

$$(|R_{Fe}-R_A|/R_{Fe}) \times 100 \quad (1)$$

where $R_{Fe}$ denotes the atomic radius of iron, and $R_A$ denotes the atomic radius of metal element attached to the steel sheet surface.

The present inventors found that, by selecting an element having wider lattice spacing for a metal element in the metal coating, a tension exerted by a ceramic coating formed on the steel sheet is increased.

In addition, the present inventors found that when element ejected from a filament during inert gas ion irradiation is attached to the steel sheet surface, the iron loss can be further reduced compared to metal ion irradiation.

Figure 1:
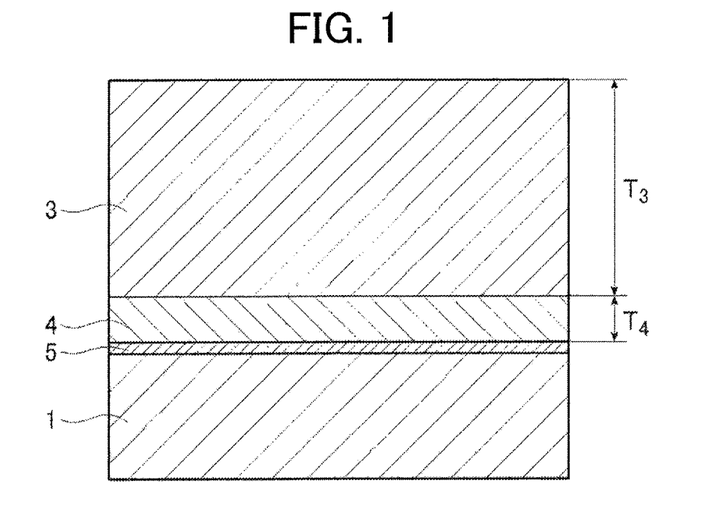
FIG. 1 is a cross-sectional view schematically showing a preferred embodiment of a grain oriented electrical steel sheet of the invention.
Figure 2:
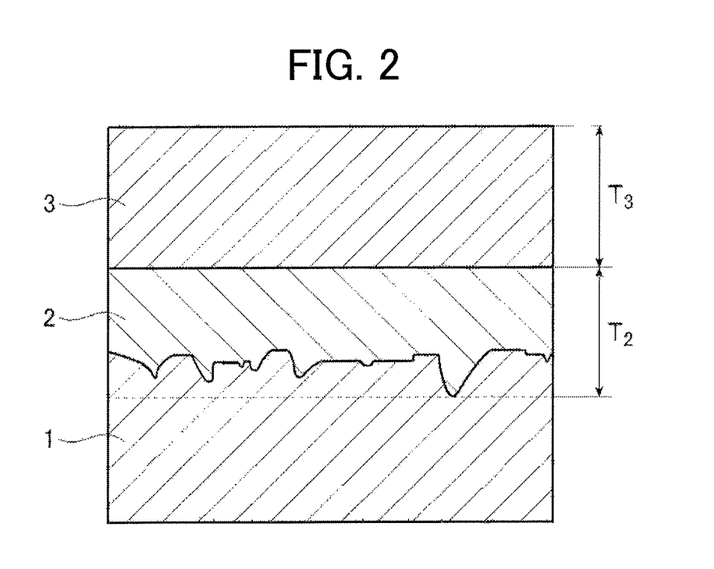
FIG. 2 is a cross-sectional view schematically showing a conventional grain oriented electrical steel sheet.

FIG. 1 is a cross-sectional view schematically showing a preferred embodiment of a grain oriented electrical steel sheet of the invention. FIG. 2 is a cross-sectional view schematically showing a conventional grain oriented electrical steel sheet.

First, as shown in FIG. 2, the conventional grain oriented electrical steel sheet is typically configured such that a forsterite coating 2 is disposed on a steel sheet 1 and an insulation tension coating 3 is formed on the forsterite coating. In FIG. 2, the thickness $T_2$ of the forsterite coating 2 is about 2 μm, and the thickness $T_3$ of the insulation tension coating 3 is about 2 μm.

On the other hand, in FIG. 1, the forsterite coating 2 in the conventional case (see FIG. 2) is replaced by a ceramic coating 4. To be more specific, a metal coating 5 is formed on a surface of the steel sheet 1 having been smoothed by chemical polishing, electrolytic polishing or another method, and the ceramic coating 4 is formed on a surface of the metal coating 5 by a CVD method or a PVD method. Since, in FIG. 1, the thickness $T_4$ of the ceramic coating 4 is for instance not more than 1.00 μm, even if the thickness $T_3$ of the insulation tension coating 3 is increased to a thickness of 2.0 μm or more, the effective steel sheet volume (lamination factor) of the grain oriented electrical steel sheet when used as a transformer is not decreased.

Since a tension applied by a coating to a steel sheet is usually proportional to the thickness of the coating, increasing the thickness of the insulation tension coating should be effective at improving the magnetic properties.

The present inventors found that, by adjusting the rotational speed of an application roll, the specific gravity of a coating chemical solution, or another factor to thereby increase the thickness of the resulting insulation tension coating, a tension applied to the associated steel sheet is increased, and thus, the resulting grain oriented electrical steel sheet can have improved magnetic properties.

[Grain Oriented Electrical Steel Sheet and Producing Method Thereof]

Again, the grain oriented electrical steel sheet according to embodiments of the invention is described below.

The grain oriented electrical steel sheet according to an embodiment of the invention is a grain oriented electrical steel sheet comprising a steel sheet; a metal coating containing metal element and disposed on the steel sheet; a coating layer A that is a ceramic coating containing an oxide in an amount of less than 30 mass % and disposed on the metal coating; and a coating layer B that is an insulation tension coating containing an oxide and disposed on the coating layer A, wherein the metal coating has a thickness of 1.0 to 10.0 nm, and the metal element has an atomic radius rate of 10% or more, the atomic radius rate being represented by Formula (1):

$$(|R_{Fe} - R_A|/R_{Fe}) \times 100 \quad (1)$$

where $R_{Fe}$ denotes an atomic radius of iron, and $R_A$ denotes an atomic radius of the metal element.

The grain oriented electrical steel sheet of the invention is excellent in the coating adhesion property after stress relief annealing (hereinafter also simply called "coating adhesion property") as well as in the magnetic properties after stress relief annealing (hereinafter also simply called "magnetic properties").

The grain oriented electrical steel sheet of the invention is described below in further detail. The following description also covers the producing method of a grain oriented electrical steel sheet according to embodiments of the present invention.

<Steel Sheet>

The type of a steel sheet is not particularly limited, and a steel sheet described below is one example.

As the ingot that forms a steel sheet, an ingot containing, as components in steel, in percentage by mass, C in an amount from 0.002% to 0.10%, Si in an amount from 2.5% to 4.0% and Mn in an amount from 0.005% to 0.50% and also containing Al in an amount from 0.010% to 0.050% and N in an amount from 0.003% to 0.020% or Al in an amount from 0.010% to 0.050%, N in an amount from 0.003% to 0.020%, Se in an amount from 0.003% to 0.030% and/or S in an amount from 0.002% to 0.03%, with the balance being inevitable impurities and Fe is preferably used for the sake of the magnetic properties. However, the ingot for use is not limited thereto.

Such an ingot is subjected to hot rolling and then several times of cold rolling with several times of annealing performed therebetween, to thereby obtain a final cold rolled steel sheet, which is in turn subjected to decarburization annealing and finishing annealing to allow secondary recrystallized grains having the Goss orientation to develop. Thus, a steel sheet is obtained. In this process, the number of times of cold rolling is preferably up to two times for achieving the balance between the magnetic properties and the cost.

Of the foregoing components in steel, C is removed through decarburization annealing, and Al, N, Se and S are purified through finishing annealing, so that these components are to be contained in the steel sheet having undergone finishing annealing in trace amounts that can be regarded as the amount of inevitable impurities.

Thereafter, a forsterite coating on a steel sheet surface is removed by pickling or another method.

Thus, it is preferred from the manufacturing aspect that, as conventionally carried out, a forsterite coating be formed on a steel sheet surface and thereafter removed by pickling. Although the formation of a forsterite coating is favorable for decarburization of a steel sheet, when another decarburization method is employed, a forsterite coating need not be formed.

After the forsterite coating is removed from the steel sheet surface, the steel sheet surface is smoothed by a method such as chemical polishing or electrolytic polishing.

Usually, as a steel sheet surface condition is rougher, the coating adhesion property further improves owing to the anchoring effect. In contrast, as a steel sheet surface condition is smoother, a magnetic domain moves more easily, and the amount of improvement in the magnetic properties when a tension stress is applied increases, accordingly.

In the present invention, even when use is made of a steel sheet having undergone chemical polishing that can smooth a steel sheet surface the most, the coating layer A (ceramic coating) does not peel off after stress relief annealing, and thus, an excellent coating adhesion property can be maintained. Therefore, it is preferable to smooth a steel sheet surface to the extent possible by chemical polishing or electrolytic polishing to have an arithmetic mean roughness Ra of not more than 0.4 μm.

<Metal Coating>

The grain oriented electrical steel sheet according to an embodiment of the invention includes a metal coating containing metal element and disposed on a surface of the steel sheet as above.

<<Metal Element>>

The metal element contained in the metal coating (hereinafter also referred to as "metal element A") is an element having an atomic radius rate of 10% or more, the atomic radius rate being represented by Formula (1) (hereinafter also simply called "atomic radius rate") according to the Hume-Rothery rules:

$$(|R_{Fe}-R_A|/R_{Fe})\times 100 \quad (1)$$

where $R_{Fe}$ denotes the atomic radius of iron, and $R_A$ denotes the atomic radius of the metal element.

When the metal coating as above is disposed between the steel sheet and the coating layer A (ceramic coating), the coating adhesion property can be improved without the dissolution of metal in the steel sheet. The magnetic properties are also excellent.

The atomic radius rate of the metal element A is preferably 20% or more. The upper limit thereof is not particularly limited and is for example 40% or less.

For the metal element A, elements having wide lattice spacing are preferred. With this, the lattice spacing of the ceramic coating formed on the metal coating is to be wide, thus leading to an increase in tension caused by lattice misfit relative to the steel sheet.

A preferred example of the metal element A as above is at least one selected from the group consisting of Ti, Y, Zr, Nb, Mo, Hf, Ta, W and C; of these, Ta or W is preferred because the coating adhesion property and the magnetic properties become more excellent.

C (carbon) listed for the metal element A is usually not considered as a metal element but shall be treated as a metal element as long as it is contained in the metal coating.

The metal element A content of the metal coating is preferably not less than 95 mass % and more preferably not less than 98 mass %; even more preferably, the metal coating is substantially made of the metal element A.

In an embodiment of the present invention, it is assumed that when the metal coating is formed by a method 1 or 2 which will be described later, the metal element A content of the resulting metal coating falls within the foregoing range.

<<Thickness>>

The metal coating has a thickness of 1.0 to 10.0 nm.

The metal coating being too thick may result in insufficient coating adhesion property and magnetic properties, while that being too thin may result in insufficient magnetic properties. When the thickness of the metal coating falls within the foregoing range, the coating adhesion property and the magnetic properties are both excellent.

For determining the thickness of the metal coating, a flake (cross-section) cut out using FIB (Focused Ion Beam) is observed with a TEM (Transmission Electron Microscope), and the average of measurements at given ten places is obtained.

<<Coating Formation Method>>

Exemplary methods of forming the metal coating on the steel sheet include: a method involving irradiation with metal ions (method 1); and a method involving irradiation with inert gas ions (method 2).

To be more specific, the method 1 is a method involving sublimating and ionizing a metal target by arc discharge and irradiating the steel sheet with the ionized metal (metal ions) to attach the metal to the steel sheet.

In the method 1, the steel sheet is irradiated with ions of the above-described metal element A using a metal target of the metal element A. Thus, the metal coating containing the metal element A is formed on the steel sheet.

Describing the method 2 more specifically, first, an inert gas (e.g., Ar gas, Kr gas, Xe gas) is introduced into a vacuum chamber, and an electric current is applied from an external power supply to a filament disposed in the vacuum chamber. Consequently, the filament glows and releases thermions. The inert gas collides with the thermions and is thereby ionized. When a minus voltage is applied to the steel sheet, the ionized inert gas (inert gas ions) is attracted to the steel sheet, so that the steel sheet surface is exposed to the gas. During this exposure, metal element ejected from the filament is attached to the steel sheet surface.

In the method 2, by using the metal element A as an element for a filament material, the metal coating containing the metal element A is formed on the steel sheet.

W or Ta is preferred as the element for the filament material. Those elements have high melting points and are thus suitable for the filament material, and in addition, are not dissolved in iron and have wide lattice spacing; therefore, the use of those elements allows the coating adhesion property and the magnetic properties to be more excellent.

Comparing the methods 1 and 2, the method 2 is preferred because this can more easily prevent the metal coating from being excessively attached and thus the smoothness of the steel sheet surface can be further improved.

With either method, ions ejected toward the steel sheet (ejected ions) are accelerated by the voltage applied to the steel sheet. The absolute value of this voltage is preferably not lower than 300 V. A too low voltage leads to low kinetic energy of ejected ions, which may result in excessive attachment to the steel sheet; when the voltage falls within the foregoing range, the amount of attachment to the steel sheet is to be proper.

The absolute value of the voltage is more preferably not lower than 500 V but not higher than 1000 V. When the voltage falls within this range, ejected ions are to have proper kinetic energy, so that the surface roughness of the steel sheet can be prevented from excessively increasing, thus resulting in further excellent coating adhesion property and magnetic properties.

The ion irradiation time is preferably not more than 10 minutes in order to achieve a lower cost and a proper amount of metal coating attachment.

<Coating Layer A: Ceramic Coating>

The grain oriented electrical steel sheet according to an embodiment of the invention has the coating layer A that is a ceramic coating disposed on a surface of the metal coating as above.

<<Composition>>

(Oxide)

The amount of oxide in the coating layer A (ceramic coating) is less than 30 mass %, preferably not more than 15 mass %, more preferably not more than 5 mass % and even more preferably not more than 2 mass %.

The amount of oxide in the ceramic coating can be measured with X-ray fluorescence using a reference sheet having a known composition.

Exemplary elements in the oxide other than oxygen (O) include those listed as elements in a non-oxide other than C and N, which is described below.

(Non-oxide)

A component (component other than the oxide) contained in the coating layer A (ceramic coating) is at least one selected from the group consisting of a carbide, a nitride and a carbonitride, for example.

When the ceramic coating contains a nitride or a carbonitride, the coating adhesion property is further improved.

When the non-oxide is at least one selected from the group consisting of a carbide, a nitride and a carbonitride, an exemplary element in the non-oxide other than C and N is at least one selected from the group consisting of Cr, Ti, Al, Si, Zr, Mo, Y, Nb, W, Fe, Mn, Ta, Ge and Hf, and of these, at least one selected from the group consisting of Cr, Ti, Al, Si, Zr, Mo, Y, Nb and W is preferred.

For the non-oxide, a nitride or a carbonitride having a rock salt structure is preferred.

The non-oxide is preferably a component contributing to improvement in oxidation resistance of a nitride or the like in the ceramic coating as much as possible. According to the Arrhenius plot formulated by P. Panjan et al. (P. Panjan et al., *Thin Solid Films* 281-282 (1996) 298.), the addition of Ti or the like to a Cr-containing nitride can bring about increased oxidation resistance. Accordingly, a non-oxide such as a nitride containing three or more elements, e.g., TiCrN or AlCrN, can also be favorably used.

The amount of non-oxide in the ceramic coating is preferably not less than 70 mass %. It is more preferable that the ceramic coating be substantially made of the non-oxide.

In an embodiment of the present invention, a value obtained by subtracting the amount of oxide from the total mass of the ceramic coating can be regarded as the amount of non-oxide in the ceramic coating.

<<Thickness>>

The thickness of the coating layer A (ceramic coating) is preferably not more than 1.00 μm, more preferably not more than 0.40 μm and even more preferably not more than 0.30 μm for the sake of suppressing an increase in cost.

On the other hand, the thickness of the ceramic coating is preferably not less than 0.01 μm because the coating adhesion property becomes more excellent.

For determining the thickness of the ceramic coating, a flake (cross-section) cut out using FIB (Focused Ion Beam) is observed with a TEM (Transmission Electron Microscope), and the average of measurements at given ten places is obtained.

<<Coating Formation Method>>

The method of forming the coating layer A (ceramic coating) is preferably a CVD (Chemical Vapor Deposition) method or a PVD (Physical Vapor Deposition) method.

A preferred CVD method is a thermal CVD method. The coating formation temperature is preferably from 900° C. to 1100° C. While the coating can be formed in the atmospheric pressure, it is preferable to reduce pressure for uniform coating formation, and thus, the pressure during coating formation is more preferably 10 to 1000 Pa for manufacturing reasons.

A preferred PVD method is an ion plating method. The coating formation temperature is preferably from 300° C. to 600° C. for manufacturing reasons. The pressure during coating formation is preferably reduced and more preferably 0.1 to 100 Pa. During the coating formation, a bias voltage of −10 to −100 V is preferably applied with the steel sheet serving as the cathode. Plasma is preferably used for ionization of a raw material because this leads to a higher coating formation rate.

When a ceramic coating containing three or more elements such as TiAlN or TiCrN is formed, a preferred coating formation method is any PVD method, with the ion plating method being more preferred. When a CVD method utilizing a thermodynamic reaction for coating formation is used, it is sometimes difficult to obtain a desired composition; since a PVD method ionizes an alloy material and allows the material to coherently precipitate, a desired composition can easily be obtained.

<Coating Layer B: Insulation Tension Coating>

The grain oriented electrical steel sheet according to an embodiment of the invention has the coating layer B that is an insulation tension coating containing an oxide and disposed on the coating layer A (ceramic coating).

<<Composition>>

The oxide contained in the insulation tension coating is appropriately determined in accordance with the composition of a coating chemical solution for use and not particularly limited. Examples thereof include: an oxide of phosphorus ($P_2O_5$); an oxide of silicon ($SiO_2$); and oxides of elements other than P and Si, such as MgO, CaO, SrO, BaO, $Al_2O_3$, $Y_2O_3$, $Cr_{2O3}$, $TiO_2$, $ZrO_2$, $MnO_2$, $Nb_2O_5$, $V_2O_5$ and $WO_3$.

In the present description, the oxides as above in the insulation tension coating are sometimes collectively called "silicon phosphate glass" or "silicon phosphate."

The amount of oxide (silicon phosphate glass) in the insulation tension coating is preferably not less than 85 mass % and more preferably not less than 95 mass %. Even more preferably, the insulation tension coating is substantially made of silicon phosphate glass.

The amount of the foregoing oxide in the insulation tension coating can be measured by X-ray fluorescence spectrometry using a standard sheet for a known composition included in an insulation tension coating.

<<Thickness>>

Figure 3:
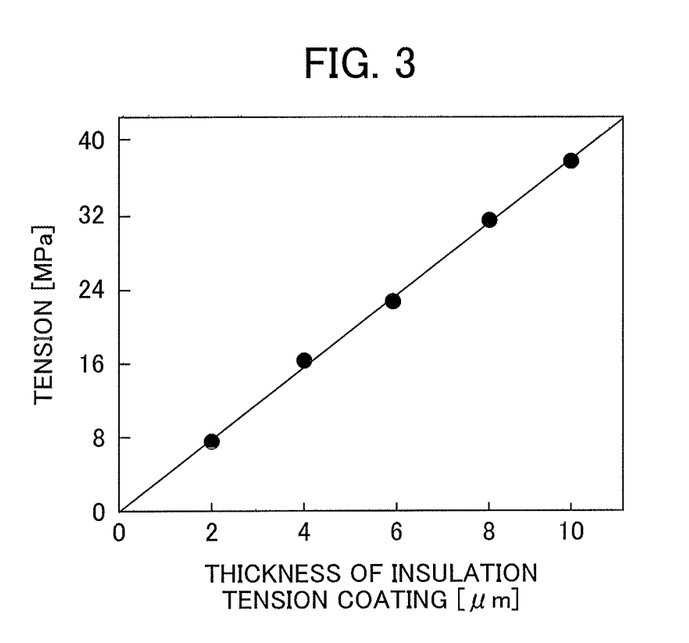
FIG. 3 is a graph showing the relationship between the thickness of an insulation tension coating and the tension that the insulation tension coating with the relevant thickness applies to the associated steel sheet.

FIG. 3 is a graph showing the relationship between the thickness of an insulation tension coating and the tension that the insulation tension coating with the relevant thickness applies to the associated steel sheet. As shown in FIG. 3, with increasing thickness of the insulation tension coating, a tension (tension stress) applied to the steel sheet increases, and as a result, the grain oriented electrical steel sheet can have excellent magnetic properties (lower iron loss).

The thickness of the insulation tension coating is preferably not less than 1.0 μm because the grain oriented electrical steel sheet can have more excellent magnetic properties.

When the insulation tension coating is too thick, however, this causes a decrease in effective steel sheet volume of the grain oriented electrical steel sheet when used as a transformer, and also an iron loss reducing effect exerted by the tension stress is saturated, so that transformer properties may rather deteriorate. Thus, the insulation tension coating has a thickness of preferably not more than 10.0 μm and more preferably not more than 5.0 μm.

For determining the thickness of the insulation tension coating, the cross-section is observed using an SEM (Scanning Electron Microscope) to measure the thickness, and the average of the measurements at given ten places is obtained.

<<Coating Formation Method>>

The method of forming the insulation tension coating is not particularly limited, and preferred examples thereof include a method involving applying a coating chemical solution onto the ceramic coating, followed by optionally drying, and then baking in a nitrogen atmosphere. This method is taken as an example and described below.

(Coating chemical solution)

The coating chemical solution preferably contains a phosphate and colloidal silica.

Exemplary metal types of the phosphate that may be preferably used include Mg, Ca, Sr, Ba, Al and Mn.

For the phosphate, a phosphate having a low thermal expansion coefficient such as a magnesium phosphate or an aluminum phosphate is preferred because this leads to easier formation of a crystal phase.

As the phosphate, a primary phosphate (biphosphate) is advantageously used from the viewpoint of availability.

The amount of phosphate in the coating chemical solution is preferably not less than 20 mol % with respect to the total solids of the coating chemical solution.

The colloidal silica contained in the coating chemical solution has an average particle size of preferably 5 to 200 nm and more preferably 10 to 100 nm. The colloidal silica content is preferably 50 to 150 parts by mass with respect to 100 parts by mass of the phosphate in terms of solid content.

The coating chemical solution may further contain chromic anhydride and/or bichromate, and the amount thereof is preferably 10 to 50 parts by mass with respect to 100 parts by mass of the phosphate in terms of solid content (dried product content).

Inorganic mineral particles such as silica powder or alumina powder may be further added to the coating chemical solution, and the amount thereof is preferably 0.1 to 10 parts by mass with respect to 100 parts by mass of the phosphate in terms of solid content.

The coating chemical solution may contain phosphoric acid in place of (or in addition to) the phosphate, and in this case, may further contain a metal compound such as a metal oxide.

(Coating Formation Condition)

The method of applying the coating chemical solution as above onto the coating layer A (ceramic coating) is not particularly limited and preferably utilizes an application roll for manufacturing cost reasons.

The baking temperature and the baking time are preferably 700° C. to 900° C. and 10 to 30 seconds, respectively, for the following reasons.

With a baking temperature of up to 900° C. and/or a baking time of up to 30 seconds, a reaction upon which precipitates are formed to cause a poor coating adhesion property between the ceramic coating and the insulation tension coating can be further suppressed, resulting in a further excellent coating adhesion property.

The coating chemical solution is dried in the first stage of formation of the insulation tension coating. With a baking temperature of not lower than 700° C. and/or a baking time of not less than 10 seconds, drying of the coating chemical solution sufficiently proceeds, so that moisture included in the coating chemical solution can adequately be removed, thus further improving a tension stress applied by the insulation tension coating to the steel sheet. In addition, oxidization of the ceramic coating caused by moisture can be suppressed during stress relief annealing.

The baking atmosphere is preferably a nitrogen atmosphere.

When the baking atmosphere is an air atmosphere, the ceramic coating may be easily oxidized due to the presence of moisture, oxygen and the like contained in the air; however, in a nitrogen atmosphere, oxidization of the ceramic coating is suppressed, resulting in a further excellent coating adhesion property.

<Stress Relief Annealing>

The grain oriented electrical steel sheet of the invention may sometimes be subjected to stress relief annealing by a demander or the like. The conditions for stress relief annealing are not particularly limited, and for instance, annealing is carried out in a nitrogen or another atmosphere at a temperature of 700° C. to 900° C. for 2 to 4 hours.

<Another Item>

To further improve the magnetic properties of the grain oriented electrical steel sheet of the invention, use may be made of the technique of refining magnetic domains of the grain oriented electrical steel sheet by forming a groove near a steel sheet surface such that the groove extends across the rolling direction of the grain oriented electrical steel sheet or by introducing a strain by laser irradiation or electron beam irradiation.

While a magnetic domain refining effect imparted by groove formation is maintained even after annealing, the degree of strain introduced by laser irradiation or electron beam irradiation is reduced through stress relief annealing carried out by a demander or the like, so that a resulting grain oriented electrical steel sheet is sometimes improper for wound core application, for example.

The grain oriented electrical steel sheet of the invention is, however, excellent in the coating adhesion property and the magnetic properties even when no stress relief annealing is carried out (for instance, in the case where the grain oriented electrical steel sheet is dedicated to pile iron cores). Therefore, in the present invention, when no stress relief annealing is carried out, the magnetic properties can be further improved by using the magnetic domain refining technique of introducing a strain.

EXAMPLES

The present invention will be specifically described below with reference to examples. However, the present invention is not limited thereto.

Test Example 1

<Production of Grain Oriented Electrical Steel Sheet>

A metal coating, a coating layer A (ceramic coating) and a coating layer B (insulation tension coating) were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to develop. Thus, a steel sheet having a forsterite coating was obtained.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

<<Metal Coating>>

Next, a metal coating of Ti (atomic radius rate: 13%) with a thickness shown in Table 1 below was formed on the steel sheet. Employing the above-described method 1 as the coating formation method, the steel sheet was irradiated with Ti metal ions with the voltage (absolute value) and irradiation time (stated as "time" in Table 1 below) as shown in Table 1 below.

<<Coating Layer A: Ceramic Coating>>

Next, a TiN ceramic coating with a thickness of 0.20 μm was formed on the metal coating by a PVD method. The amount of oxide in the ceramic coating was not more than 2 mass % in each case. For the PVD method, the ion plating method was used, and the coating formation was carried out under conditions of 450° C., 3 Pa and a bias voltage of −20 V.

<<Coating Layer B: Insulation Tension Coating>>

Next, a coating chemical solution was applied onto the ceramic coating with an application roll, dried, and then baked in a nitrogen atmosphere at 850° C. for 15 seconds. Thus, an insulation tension coating with a thickness of 2.0 μm was formed.

For the coating chemical solution, used was a coating chemical solution containing 100 parts by mass of magnesium phosphate (magnesium phosphate monobasic), 80 parts by mass of colloidal silica (AT-30 manufactured by ADEKA Corporation; average particle size, 10 nm) and 20 parts by mass of chromic anhydride (the same solution was also used in Test examples 2 to 4 described below).

<Evaluation>

Each of the obtained grain oriented electrical steel sheets was subjected to stress relief annealing in a nitrogen atmosphere at 800° C. for 3 hours. Thereafter, the evaluation was made as follows.

<<Coating Adhesion Property>>

The grain oriented electrical steel sheet having undergone stress relief annealing was wound around round bars having diameters different on a 5-millimeter basis, i.e., diameters of 5 mm, 10 mm, . . . (but including a round bar having a diameter of 3 mm) to determine the minimum diameter (unit: mm) from among diameters with which the ceramic coating did not peel off. The results are shown in Table 1 below. As the minimum diameter of diameters with which the coating does not peel off (i.e., no peel-off diameter) is smaller, the coating adhesion property after stress relief annealing can be rated as more excellent, and a no peel-off diameter of less than 30 mm is favorable.

<<Iron Loss $W_{17/50}$>>

For the grain oriented electrical steel sheet having undergone stress relief annealing, the iron loss $W_{17/50}$ was measured. The results are shown in Table 1 below. When the iron loss $W_{17/50}$ (unit: W/kg) is less than 0.80, the magnetic properties after stress relief annealing can be rated as excellent.

TABLE 1

| | Metal coating | | | | | |
|---|---|---|---|---|---|---|
| | Coating formation condition | | | Evaluation | | |
| | | | | Coating adhesion | Iron loss | |
| No. | Voltage [V] | Time [min] | Thickness [nm] | property [mm φ] | $W_{17/50}$ [W/kg] | Remarks |
| 1 | 100 | 1 | 20.0 | 50 | 0.93 | Comparative example |
| 2 | 100 | 5 | 50.0 | 35 | 0.88 | Comparative example |
| 3 | 100 | 10 | 85.0 | 50 | 0.86 | Comparative example |
| 4 | 100 | 20 | 115.0 | 60 | 0.89 | Comparative example |
| 5 | 300 | 1 | 5.0 | 20 | 0.79 | Inventive example |
| 6 | 300 | 5 | 7.0 | 15 | 0.74 | Inventive example |
| 7 | 300 | 10 | 10.0 | 15 | 0.71 | Inventive example |
| 8 | 300 | 20 | 15.0 | 35 | 0.83 | Comparative example |
| 9 | 500 | 1 | 2.0 | 20 | 0.77 | Inventive example |
| 10 | 500 | 5 | 4.0 | 10 | 0.71 | Inventive example |
| 11 | 500 | 10 | 5.0 | 10 | 0.68 | Inventive example |
| 12 | 500 | 20 | 6.0 | 15 | 0.73 | Inventive example |
| 13 | 750 | 1 | 2.0 | 15 | 0.75 | Inventive example |
| 14 | 750 | 5 | 3.0 | 5 | 0.70 | Inventive example |
| 15 | 750 | 10 | 3.0 | 10 | 0.70 | Inventive example |
| 16 | 750 | 20 | 5.0 | 15 | 0.74 | Inventive example |
| 17 | 1000 | 1 | 1.0 | 15 | 0.78 | Inventive example |
| 18 | 1000 | 5 | 2.0 | 5 | 0.71 | Inventive example |
| 19 | 1000 | 10 | 2.0 | 5 | 0.72 | Inventive example |
| 20 | 1000 | 20 | 3.0 | 10 | 0.77 | Inventive example |
| 21 | 1250 | 1 | 0.5 | 10 | 0.81 | Comparative example |
| 22 | 1250 | 5 | 0.5 | 3 | 0.81 | Comparative example |
| 23 | 1250 | 10 | 0.5 | 5 | 0.83 | Comparative example |
| 24 | 1250 | 20 | 0.5 | 5 | 0.86 | Comparative example |

As can be seen in Table 1 above, with the grain oriented electrical steel sheets of the inventive examples in each of which the thickness of the metal coating of Ti (atomic radius rate: 13%) is in a range of 1.0 to 10.0 nm, the no peel-off diameter is up to 20 mm and thus small, which means an excellent coating adhesion property, and the iron loss $W_{17/50}$ is less than 0.80, which means excellent magnetic properties.

Test Example 2

<Production of Grain Oriented Electrical Steel Sheet>

A metal coating, a coating layer A (ceramic coating) and a coating layer B (insulation tension coating) were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to-develop. Thus, a steel sheet having a forsterite coating was obtained.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

<<Metal Coating>>

Next, a metal coating of a metal element shown in Table 2 below was formed on the steel sheet. The thickness of the metal coating was 3.0 nm in each case.

In Nos. 1 to 17, employing the above-described method 1 as the coating formation method, the steel sheet was irradiated with metal ions of ejected ion species shown in Table 2 below.

In Nos. 18 to 23, employing the above-described method 2 as the coating formation method, with the use of a filament material shown in Table 2 below, the steel sheet was irradiated with inert gas ions of ejected ion species shown in Table 2 below.

In either method, the absolute value of the voltage was 750 V, and the ion irradiation time was 5 minutes.

<<Coating Layer A: Ceramic Coating>>

Next, a TiN ceramic coating with a thickness of 0.20 µm was formed on the metal coating by a PVD method. The amount of oxide in the ceramic coating was not more than 2 mass % in each case. For the PVD method, the ion plating method was used, and the coating formation was carried out under conditions of 450° C., 3 Pa and a bias voltage of −20 V.

<<Coating Layer B; Insulation Tension Coating>>

Next, a coating chemical solution was applied onto the ceramic coating with an application roll, dried, and then baked in a nitrogen atmosphere at 850° C. for 15 seconds. Thus, an insulation tension coating with a thickness of 2.0 µm was formed.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manners as in Test Example 1. The results are shown in Table 2 below.

TABLE 2

| | Metal coating | | | | | |
|---|---|---|---|---|---|---|
| | Coating formation condition | | | Evaluation | | |
| No. | Ejected ion species | Filament material | Metal element | Atomic radius rate | Coating adhesion property [mm φ] | Iron loss $W_{17/50}$ [W/kg] | Remarks |
| 1 | Zn | — | Zn | 7% | 50 | 0.99 | Comparative example |
| 2 | V | — | V | 4% | 55 | 0.96 | Comparative example |
| 3 | Cr | — | Cr | 1% | 55 | 0.97 | Comparative example |
| 4 | Mn | — | Mn | 1% | 70 | 0.98 | Comparative example |
| 5 | Fe | — | Fe | 1% | 60 | 0.94 | Comparative example |
| 6 | Co | — | Co | 1% | 55 | 0.96 | Comparative example |
| 7 | Ni | — | Ni | 2% | 45 | 0.97 | Comparative example |
| 8 | Cu | — | Cu | 1% | 60 | 0.95 | Comparative example |
| 9 | Ti | — | Ti | 13% | 5 | 0.70 | Inventive example |
| 10 | Y | — | Y | 38% | 5 | 0.69 | Inventive example |
| 11 | Nb | — | Nb | 15% | 5 | 0.71 | Inventive example |
| 12 | Mo | — | Mo | 11% | 10 | 0.73 | Inventive example |
| 13 | Hf | — | Hf | 23% | 5 | 0.70 | Inventive example |
| 14 | Zr | — | Zr | 24% | 5 | 0.69 | Inventive example |
| 15 | C | — | C | 34% | 10 | 0.79 | Inventive example |
| 16 | W | — | W | 11% | 5 | 0.69 | Inventive example |
| 17 | Ta | — | Ta | 15% | 5 | 0.71 | Inventive example |
| 18 | Ar | W | W | 11% | 3 | 0.66 | Inventive example |
| 19 | Ar | Ta | Ta | 15% | 3 | 0.65 | Inventive example |
| 20 | Kr | W | W | 11% | 3 | 0.67 | Inventive example |
| 21 | Kr | Ta | Ta | 15% | 3 | 0.67 | Inventive example |
| 22 | Xe | W | W | 11% | 3 | 0.68 | Inventive example |
| 23 | Xe | Ta | Ta | 15% | 3 | 0.67 | Inventive example |

As can be seen in Table 2 above, with the grain oriented electrical steel sheets of the inventive examples in each of which the metal coating has an atomic radius rate of not less than 10%, the no peel-off diameter is up to 20 mm and thus small, which means an excellent coating adhesion property, and the iron loss $W_{17/50}$ is less than 0.80, which means excellent magnetic properties.

When the inventive examples are compared, those inventive examples in each of which the metal element of the metal coating is Ta or W have a more excellent coating adhesion property.

Test Example 3

<Production of Grain Oriented Electrical Steel Sheet>

A metal coating, a coating layer A (ceramic coating) and a coating layer B (insulation tension coating) were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to develop. Thus, a steel sheet having a forsterite coating was obtained.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

<<Metal Coating>>

Next, a metal coating of W (atomic radius rate: 11%) was formed on the steel sheet. The thickness of the metal coating was 3.0 nm in each case.

Employing the above-described method 2 as the coating formation method, with the use of W as a filament material, the steel sheet was irradiated with Ar gas. The absolute value of the voltage was 750 V, and the ion irradiation time was 5 minutes.

<<Coating Layer A: Ceramic Coating>>

Next, a ceramic coating having the composition shown in Table 3 below was formed to have a thickness shown in Table 3 below on the steel sheet by a CVD method or a PVD method. The amount of oxide in the ceramic coating was not more than 2 mass % in each case.

For the CVD method, the thermal CVD method was used, and the coating formation was carried out under conditions of 1050° C. and 1000 Pa. For the PVD method, the ion plating method was used, and the coating formation was carried out under conditions of 450° C., 3 Pa and a bias voltage of −20 V.

<<Coating Layer B: Insulation Tension Coating>>

Next, a coating chemical solution was applied onto the ceramic coating with an application roll, dried, and then baked in a nitrogen atmosphere at 850° C. for 15 seconds. Thus, an insulation tension coating with a thickness of 2.0 µm was formed.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manners as in Test Example 1. The results are shown in Table 3 below.

TABLE 3

| No. | Coating layer A (Ceramic coating) | | | Evaluation | | Remarks |
|---|---|---|---|---|---|---|
| | Coating formation method | Composition | Thickness [µm] | Coating adhesion property [mm φ] | Iron loss $W_{17/50}$ [W/kg] | |
| 1 | CVD | TiN | 0.01 | 20 | 0.71 | Inventive example |
| 2 | CVD | TiN | 0.10 | 5 | 0.73 | Inventive example |
| 3 | CVD | TiN | 0.40 | 3 | 0.59 | Inventive example |
| 4 | CVD | CrN | 0.01 | 15 | 0.77 | Inventive example |
| 5 | CVD | CrN | 0.10 | 5 | 0.75 | Inventive example |
| 6 | CVD | CrN | 0.40 | 3 | 0.63 | Inventive example |
| 7 | PVD | TiN | 0.01 | 15 | 0.77 | Inventive example |
| 8 | PVD | TiN | 0.10 | 5 | 0.73 | Inventive example |
| 9 | PVD | TiN | 0.40 | 3 | 0.57 | Inventive example |
| 10 | PVD | TiAlN | 0.10 | 3 | 0.71 | Inventive example |
| 11 | PVD | TiSiN | 0.10 | 5 | 0.72 | Inventive example |
| 12 | PVD | TiZrN | 0.10 | 5 | 0.72 | Inventive example |
| 13 | PVD | TiMoN | 0.10 | 10 | 0.70 | Inventive example |
| 14 | PVD | TiYN | 0.10 | 5 | 0.69 | Inventive example |
| 15 | PVD | TiNbN | 0.10 | 5 | 0.69 | Inventive example |
| 16 | PVD | TiWN | 0.10 | 10 | 0.74 | Inventive example |
| 17 | PVD | TiC | 0.10 | 15 | 0.73 | Inventive example |
| 18 | PVD | TiCN | 0.10 | 10 | 0.77 | Inventive example |
| 19 | PVD | TiCrN | 0.10 | 3 | 0.68 | Inventive example |
| 20 | PVD | AlCrN | 0.10 | 3 | 0.67 | Inventive example |
| 21 | PVD | SiCrN | 0.10 | 5 | 0.68 | Inventive example |
| 22 | PVD | ZrCrN | 0.10 | 10 | 0.71 | Inventive example |
| 23 | PVD | MoCrN | 0.10 | 10 | 0.72 | Inventive example |
| 24 | PVD | YCrN | 0.10 | 5 | 0.72 | Inventive example |
| 25 | PVD | NbCrN | 0.10 | 10 | 0.74 | Inventive example |
| 26 | PVD | WCrN | 0.10 | 10 | 0.71 | Inventive example |

As can be seen in Table 3 above, with the grain oriented electrical steel sheets of the inventive examples, the no peel-off diameter is less than 30 mm, which means an excellent coating adhesion property, and the iron loss $W_{17/50}$ is less than 0.80, which means excellent magnetic properties.

In Table 2 above, when the inventive examples with the ceramic coatings having a thickness of 0.10 µm are compared, those inventive examples in each of which the ceramic coating has either of the compositions TiCrN and AlCrN show further excellent coating adhesion property and magnetic properties.

Test Example 4

<Production of Grain Oriented Electrical Steel Sheet>

A metal coating, a coating layer A (ceramic coating) and a coating layer B (insulation tension coating) were formed in this order on a steel sheet as described below, thereby obtaining a grain oriented electrical steel sheet.

<<Steel Sheet>>

Use was made of an ingot containing, as components in steel, in percentage by mass, C in an amount of 0.05%, Si in an amount of 3.2%, Mn in an amount of 0.05%, Al in an amount of 0.03%, N in an amount of 0.005% and Se in an amount of 0.01%, with the balance being inevitable impurities and Fe.

The ingot was subjected to hot rolling, hot band annealing, and two times of cold rolling with intermediate annealing performed therebetween, to thereby obtain a final cold rolled steel sheet with a thickness of 0.23 mm, which was in turn subjected to decarburization annealing and finishing annealing to allow Goss orientation secondary recrystallized grains to develop. Thus, a steel sheet having a forsterite coating was obtained.

Subsequently, of the obtained steel sheet having a forsterite coating, the forsterite coating on a steel sheet surface was removed by pickling, whereafter the surface was smoothed by chemical polishing using hydrofluoric acid. Thus, a steel sheet was obtained. The thickness of the steel sheet after the chemical polishing was 0.22 mm.

<<Metal Coating>>

Next, a metal coating of W (atomic radius rate: 11%) was formed on the steel sheet. The thickness of the metal coating was 3.0 nm in each case.

Employing the above-described method 2 as the coating formation method, with the use of W as a filament material, the steel sheet was irradiated with Ar gas. The absolute value of the voltage was 750 V, and the ion irradiation time was 5 minutes.

<<Coating Layer A: Ceramic Coating>>

Next, a TiN ceramic coating with a thickness of 0.10 μm was formed on the metal coating by a PVD method. The amount of oxide in the ceramic coating was not more than 2 mass % in each case. For the PVD method, the ion plating method was used, and the coating formation was carried out under conditions of 450° C., 3 Pa and a bias voltage of −20 V.

<<Coating Layer B: Insulation Tension Coating>>

Next, a coating chemical solution was applied onto the ceramic coating with an application roll, dried, and then baked in a nitrogen atmosphere at 850° C. for 15 seconds. Thus, an insulation tension coating with a thickness shown in Table 4 below was formed.

<Evaluation>

Each of the obtained grain oriented electrical steel sheets was subjected to stress relief annealing in a nitrogen atmosphere at 800° C. for 3 hours and then evaluated for the coating adhesion property and magnetic properties after stress relief annealing in the same manners as in Test Example 1. The results are shown in Table 4 below.

TABLE 4

| | Coating layer B | Evaluation | | |
|---|---|---|---|---|
| No. | (Insulation tension coating) Thickness [μm] | Coating adhesion property [mmφ] | Iron loss $W_{17/50}$ [W/kg] | Remarks |
| 1 | 1.0 | 5 | 0.73 | Inventive example |
| 2 | 2.0 | 5 | 0.67 | Inventive example |
| 3 | 4.0 | 5 | 0.63 | Inventive example |
| 4 | 6.0 | 5 | 0.61 | Inventive example |
| 5 | 8.0 | 5 | 0.59 | Inventive example |
| 6 | 10.0 | 10 | 0.58 | Inventive example |

As can be seen in Table 4 above, with the grain oriented electrical steel sheets of the inventive examples, the no peel-off diameter is less than 30 mm, which means an excellent coating adhesion property, and the iron loss $W_{17/50}$ is less than 0.80, which means excellent magnetic properties. In Table 4 above, comparison between the inventive examples reveals that there is the tendency in which as the insulation tension coating has a larger thickness, the magnetic properties are more excellent.

REFERENCE SIGNS LIST

1: steel sheet
2: forsterite coating
3: insulation tension coating
4: ceramic coating
5: metal coating
$T_2$: forsterite coating thickness
$T_3$: insulation tension coating thickness
$T_4$: ceramic coating thickness

The invention claimed is:

1. A grain oriented electrical steel sheet, comprising:
   a steel sheet;
   a coating C containing a metal element or carbon, and disposed on the steel sheet;
   a coating layer A that is a ceramic coating containing an oxide in an amount of less than 30 mass % and disposed on the coating C; and
   a coating layer B that is an insulation tension coating containing an oxide and disposed on the coating layer A,
   wherein the coating C has a thickness of 1.0 to 10.0 nm, and
   wherein the metal element has an atomic radius rate of 10% or more, the atomic radius rate being represented by Formula (1):

$$(|R_{Fe}-R_A|/R_{Fe})\times 100 \quad (1)$$

where $R_{Fe}$ denotes an atomic radius of iron, and $R_A$ denotes an atomic radius of the metal element, and
   wherein a content of the metal element or carbon in the coating C is not less than 95 mass %.

2. The grain oriented electrical steel sheet according to claim 1,
   wherein the metal element is at least one selected from the group consisting of Ti, Y, Zr, Nb, Mo, Hf, Ta, and W.

3. The grain oriented electrical steel sheet according to claim 1,
   wherein the metal element is Ta or W.

4. The grain oriented electrical steel sheet according to claim 1,
   wherein the coating layer A has a thickness of not less than 0.01 μm, and
   wherein the coating layer A has a thickness of not more than 0.40 μm.

5. The grain oriented electrical steel sheet according to claim 4,
   wherein the coating layer B has a thickness of not less than 1.0 μm, and
   wherein the coating layer B has a thickness of not more than 10.0 μm.

6. The grain oriented electrical steel sheet according to claim 1,
   wherein the coating layer A contains a nitride or a carbonitride.

7. The grain oriented electrical steel sheet according to claim 2,
   wherein the coating layer A has a thickness of not less than 0.01 μm, and
   wherein the coating layer A has a thickness of not more than 0.40 μm.

8. The grain oriented electrical steel sheet according to claim 3,
   wherein the coating layer A has a thickness of not less than 0.01 μm, and
   wherein the coating layer A has a thickness of not more than 0.40 μm.

9. The grain oriented electrical steel sheet according to claim 7,
   wherein the coating layer B has a thickness of not less than 1.0 μm, and wherein the coating layer B has a thickness of not more than 10.0 μm.

10. The grain oriented electrical steel sheet according to claim 8,
wherein the coating layer B has a thickness of not less than 1.0 μm, and
wherein the coating layer B has a thickness of not more than 10.0 μm.

11. The grain oriented electrical steel sheet according to claim 2,
wherein the coating layer A contains a nitride or a carbonitride.

12. The grain oriented electrical steel sheet according to claim 3,
wherein the coating layer A contains a nitride or a carbonitride.

13. The grain oriented electrical steel sheet according to claim 4,
wherein the coating layer A contains a nitride or a carbonitride.

14. The grain oriented electrical steel sheet according to claim 5,
wherein the coating layer A contains a nitride or a carbonitride.

15. The grain oriented electrical steel sheet according to claim 7,
wherein the coating layer A contains a nitride or a carbonitride.

16. The grain oriented electrical steel sheet according to claim 8,
wherein the coating layer A contains a nitride or a carbonitride.

17. The grain oriented electrical steel sheet according to claim 9,
wherein the coating layer A contains a nitride or a carbonitride.

18. The grain oriented electrical steel sheet according to claim 10,
wherein the coating layer A contains a nitride or a carbonitride.

19. A grain oriented electrical steel sheet producing method of producing the grain oriented electrical steel sheet according to claim 1,
wherein the coating C is formed by irradiating the steel sheet with metal ions or carbon ions to attach the metal ions or carbon ions to the steel sheet or by attaching, to the steel sheet, the metal element ejected from a filament during irradiation of the steel sheet with inert gas ions.

20. The grain oriented electrical steel sheet producing method according to claim 19,
wherein the coating layer A is formed by a chemical vapor deposition method or a physical vapor deposition method, and
wherein the coating layer B is formed by applying a coating chemical solution on the coating layer A with an application roll, followed by baking in a nitrogen atmosphere.

* * * * *